United States Patent
Hild

(10) Patent No.: US 8,212,264 B2
(45) Date of Patent: Jul. 3, 2012

(54) FK MODULE AND METHOD FOR THE PRODUCTION THEREOF

(75) Inventor: Olaf Ruediger Hild, Radebeul (DE)

(73) Assignee: Fraunhofer-Gesellschaft zur Foerderung der Angewandten Forschung E.V., Müchen (DE)

( * ) Notice: Subject to any disclaimer, the term of this patent is extended or adjusted under 35 U.S.C. 154(b) by 298 days.

(21) Appl. No.: 12/666,949

(22) PCT Filed: Jul. 17, 2008

(86) PCT No.: PCT/DE2008/001175
§ 371 (c)(1),
(2), (4) Date: May 11, 2010

(87) PCT Pub. No.: WO2009/010052
PCT Pub. Date: Jan. 22, 2009

(65) Prior Publication Data
US 2010/0219420 A1 Sep. 2, 2010

(30) Foreign Application Priority Data
Jul. 19, 2007 (DE) .......................... 10 2007 034 252

(51) Int. Cl.
*H01L 27/15* (2006.01)
*H01L 33/00* (2010.01)

(52) U.S. Cl. ..... 257/81; 257/99; 257/724; 257/E25.004; 257/E21.499; 438/25; 438/28; 438/400

(58) Field of Classification Search ............ 257/81, 257/99, 724, E25.004, E21.499; 438/25, 438/28, 400
See application file for complete search history.

(56) References Cited

U.S. PATENT DOCUMENTS

| 4,019,924 A | 4/1977 | Kurth |
| 7,601,988 B2 * | 10/2009 | Seo et al. .................... 257/88 |
| 2008/0011350 A1 | 1/2008 | Luch |

FOREIGN PATENT DOCUMENTS

| DE | 27 57 301 | 7/1979 |
| EP | 0 874 404 | 4/1998 |
| JP | 60 245158 | 12/1985 |
| JP | 2004 342768 | 12/2004 |
| WO | 2005 / 045947 | 5/2005 |
| WO | 2005 / 078799 | 8/2005 |

* cited by examiner

*Primary Examiner* — Tu-Tu Ho
(74) *Attorney, Agent, or Firm* — Fay Kaplun & Marcin, LLP

(57) ABSTRACT

A module and method of its production in which areal electronic components are formed. The module includes (a) a cover electrode covering the electronic components; (b) a flexibly deformable substrate; (c) a base electrode formed on the substrate; and (d) an optically active layer formed on the base electrode. The electronic components are formed on the flexibly deformable substrate by the optically active layer, the cover electrode; and the base electrode. The cover electrode projects over the optically active layer at a first side and the base electrode extends beyond the optically active layer at a second side which is oppositely disposed with regards to the first side. The components are arranged at a spacing from one another on the substrate and thereby a free substrate surface is present between components so that, on a folding in a region of the free substrate surface, the base electrode and the cover electrode are adjacent and contact one another areally and an electrically conductive touching contact is established. The electronic components are electrically connected in series with one another.

32 Claims, 4 Drawing Sheets

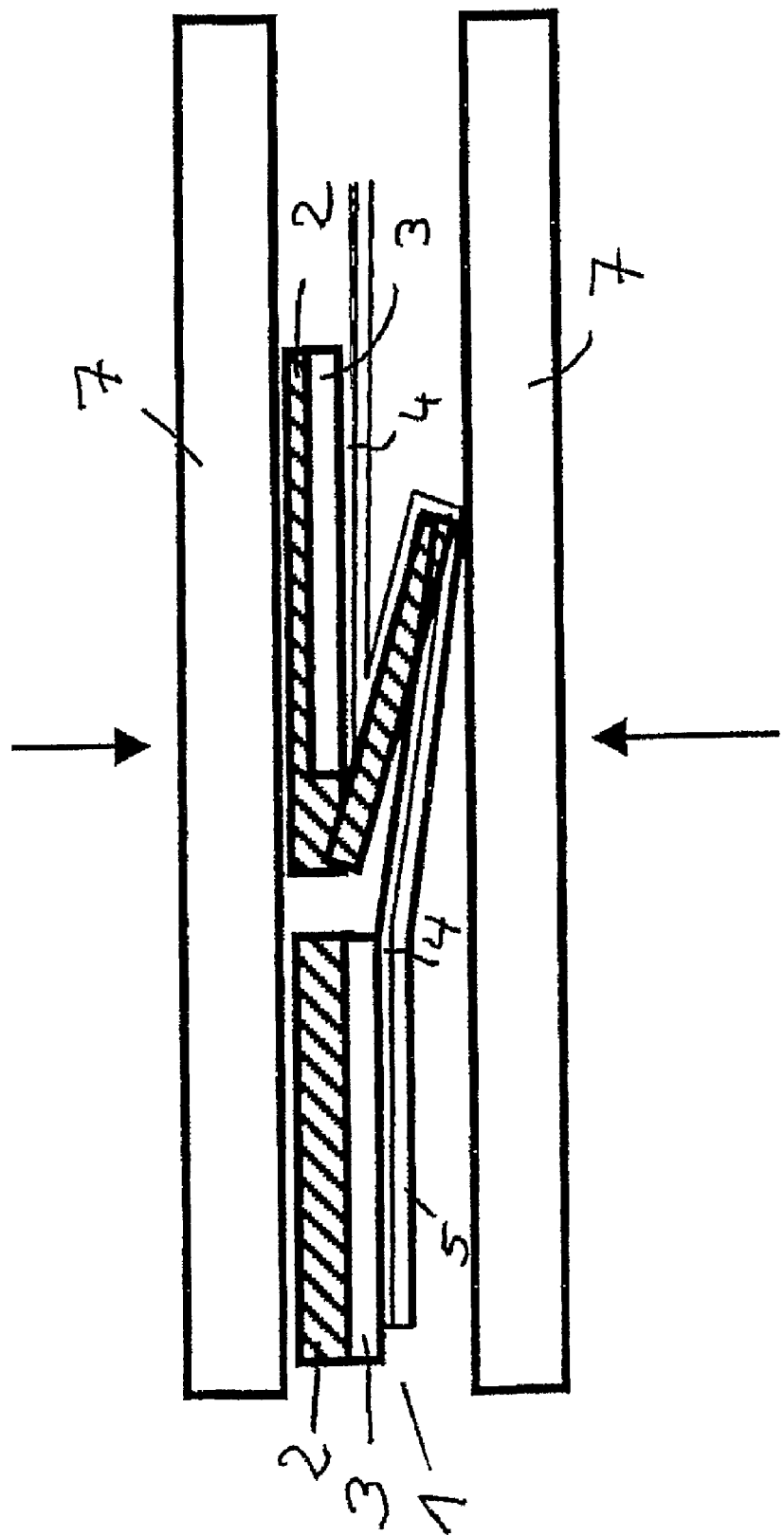

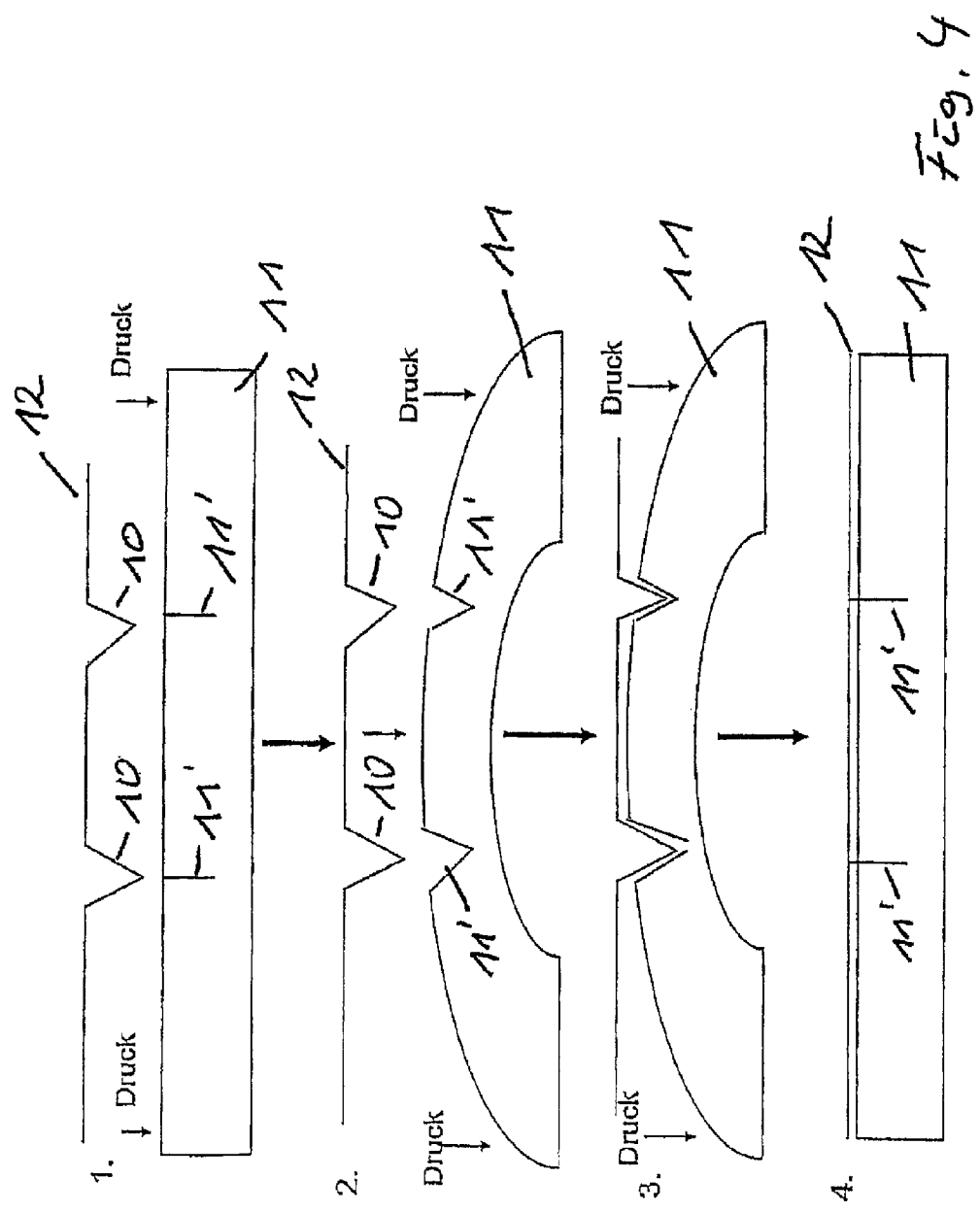

FK MODULE AND METHOD FOR THE PRODUCTION THEREOF

FIELD OF INVENTION

The invention relates to modules and to methods for their manufacture in which planar electronic components are formed on a flexible substrate which should be electrically conductively connected to one another, wherein a plurality of electronic components should form a series connection. Modules in accordance with the invention can thus in particular be solar modules or light-emitting panels and in this respect at least two electronic components should be present on a substrate with which a module in accordance with the invention should be formed.

In the event that a module in accordance with the invention should be an LED panel, the electronic components can preferably be organic light-emitting diodes (OLEDs).

BACKGROUND INFORMATION

It is thus known, for example in the manufacture of also flexible solar cell modules, to connect the individual solar cells electrically conductively to one another by an overlapping of different electrodes. Individual defective solar cells, as an example for electronic components also usable in an invention, cannot be removed in the case of a defect. There is, however, the possibility of short-circuiting such defective solar cells. The complete functional capability can thereby basically be obtained. However, it is not possible to avoid a reduction of the active usable area of a solar module which can be used for the gaining of electric energy.

If light-emitting electronic components, in particular organic light-emitting diodes, are used, such defects can, for example, be taken into account if an electrically conductive connection of or to such an organic light-emitting diode is separated, but the defects are also remedied in an insufficient manner here. Electrical short-circuits, however, result in a complete failure of such a module.

It is known that it is necessary in solar cells and in organic light-emitting diodes to connect a plurality of such electronic components electrically conductively to one another and to realize this in the form of an electrical series connection. With solar cells, the electric voltage obtained by solar radiation can thus be increased to much more effectively usable electrical voltage values since with organically based solar cells, for example, a single such solar cell can achieve a voltage in the range between 0.5 to 1.1 V.

A meaningful gaining of electric energy can only take place with voltages above 2 V, which should preferably be much higher. It is therefore desired that, where possible, all individual electronic components, in particular solar cells, should be functional to be able to achieve the desired electrical voltage of a solar module.

With solar cells and organic light-emitting diodes, it should, however, be taken into account that the respective electronic components have a limited length over electrodes present at such cells in the direction of the electrical current flow since cover electrodes in particular formed as optically transparent have relatively high specific electrical resistances as a consequence of the required optical transparency. In an axial direction aligned perpendicular thereto, such electronic components such as solar cells and organic light-emitting diodes can, however, have much longer dimensions. Modules with relatively large useful areas can thereby be obtained which are only formed with a single electronic component or one solar cell or a single organic light-emitting diode. With such large-dimensioned electronic components, a failure of an individual such element on a module therefore also has a substantial effect.

SUMMARY OF INVENTION

The present invention relates to modules with planar electronic components which can be manufactured cost-effectively and in which defects which occur at individual electronic components or at electrically conductive connections between electronic components can be easily compensated.

Modules in accordance with the invention are in this respect formed so that a plurality of planar electronic components are formed on a flexibly deformable substrate. In this connection, with each electronic component, a base electrode is formed on a surface of such a substrate and in turn an optically active layer is formed thereon and a cover electrode is then formed on this. An electrical series connection is then achieved in that a cover electrode of an electronic component is electrically conductively connected to a base electrode of an electronic component next to the first-named electronic component. In accordance with the invention, in this respect, the cover electrode is formed on the optically active layer so that it projects over the optically active layer at one side. The base electrode of the respective electronic component projects over the electronic component on the oppositely disposed side in the direction of the electrical current flow.

The individual electronic components are arranged on the substrate surface such that they have a spacing from one another and consequently a free substrate surface remains between electronic components arranged next to one another.

A module can then be folded so that folds form in the region of the free substrate surface and the base electrode and the cover electrode of electronic components arranged next to one another contact one another areally and an electrically conductive touching contact is thereby established between the electronic components arranged next to one another.

Substrates suitable for the module in accordance with the invention can be paper, cardboard, polymer films or also metal films which can also, optionally, be a composite of such materials or films. Substrates can, however, also be formed from flexibly deformable glass. Flexible fabrics can also be used for substrates.

It results from this that substrates can also be formed in the form of single-layer or multilayer systems, with them being impermeable for liquids and/or gases.

A substrate can, however, also satisfy other protective functions by additional layers, planarization layers or barrier layers. The additional advantageous properties which can result in an increased protection can, however, also be achieved directly with substrate materials, which can be possible, for example, with a copolymerization, mixtures of substances and materials or by interpenetrating networks.

However, paper is in particular to be especially preferred as the substrate material due to its good processing capability, flexible deformability and the possible cost-effective manufacture. Paper can in this respect also be coated to achieve a better protection against moisture, for example. A paper or also another substance should be used for substrates which cannot shrink or expand or only shrinks or expands slightly. The electrical conductivity can be improved with additional elements such as bus bars or grids.

Since the electrically conductive connection of electronic components arranged next to one another took place by a folding in the region of free substrate surfaces, the module thus present can be held compressed with the aid of at least two elements exerting a compression force onto a module, with the compressive force being able to be exerted onto the optically active side of a module in accordance with the invention and onto its rear side.

Suitable elements for this purpose are, for example, plate-shaped elements with which additionally a protection against external environmental influences such as the penetration or diffusion of gases or liquids can be achieved.

A plate-shaped element or differently formed plate-shaped elements which are arranged on the optically active side of a module should likewise be optically transparent, which should apply to at least the respectively used wavelength range.

Elements formed differently than plate-shaped elements and with which a module can be compressed should preferably be arranged in the region of folds and should also develop their force effect there.

It is moreover favorable to form a substrate with electronic components so that they are arranged such that the outer marginal region of the respectively used substrate is kept free peripherally, but is at least kept free at two side margins arranged opposite one another. These outer marginal regions which are kept free can likewise be folded over in order thereby to be able to form an outer edge protection at the marginal side, also against external environmental influences.

Since, as already addressed in the introductory part of the description, the base electrodes and in particular the cover electrodes were frequently formed from a substance or from a chemical compound whose electrical specific resistance is relatively high, it can be advantageous to provide the base electrodes and/or the cover electrodes at least regionally and then at least in regions with which an electrically conductive connection to an electronic component arranged adjacent thereto should be established with a coating which then has a smaller specific electrical resistance than the respective electrode. This is not critical since this region should only be used for the electrical line and the optical activity is thereby not influenced.

This effect, and a further advantage which will be looked at again in the following, can be achieved, for example, with an electrical conductive adhesive which is electrically conductive and with which a connection between a base electrode and a cover electrode of a further electronic component arranged next to the electronic component with the base electrode can be established with material continuity and with electrical conductivity.

It can moreover be favorable if a module in accordance with the invention is convexly or concavely curved in the folded condition. With a concave curving, a hollow cylindrical design can thus be formed which is open at one side and the concavely curved surface can also still be used in a functional manner. Increased contact pressures at folds and also at the cover electrodes and base electrodes pressed toward one another can thereby be achieved which can result in an increased electrical contact. Convex curvatures can be desirable, for example, in modules formed for illumination or as a display.

Modules in accordance with the invention can, however, also be formed three-dimensionally by suitable folding. In this respect, surfaces which are aligned in different directions and are arranged in different planes can be present on a folded module. There is also the possibility of being able to use a front side and a rear side of a correspondingly folded module.

However, electronic components can also be formed at a module in a series and column arrangement in the form of an array on a substrate.

There is also the possibility in this respect to electrically conductively connect the electronic components arranged above one another electrically conductively by a second folding of the substrate.

In this respect, a module can be formed so that, at electronic components, at a side which is formed at right angles to a side at which the cover electrode projects over the optically active layer, the cover electrode likewise projects over the optically active layer. The base electrode projects over the optically active layer at the side of the electronic component disposed opposite it. The components arranged above one another are arranged at a right angle on the substrate likewise at a spacing from one another. A free substrate surface is thereby likewise present between these components there. On this folding at a right angle to a first fold in the region of this free substrate surface, the base electrode and the cover electrode of electronic components arranged above one another are disposed areally to one another and an electrically conductive touching contact can thus be established. For this purpose, incisions can be formed in the substrate which facilitate such a folding.

However, not all electronic components have to be connected electrically in series to one another at a module in accordance with the invention. Electronic components can also be electrically conductively connected to one another on a substrate without an electrical series connection being formed with these electronic components. For this purpose, two or more electronic components are electrically conductively connected to one another after a folding so that the cover electrodes and/or base electrodes of these electronic components are contacted with one another.

On the folding of a substrate provided with electronic components, the folds can be formed in U shape or in V shape, with the regions of the base electrode and of the cover electrode then representing the electrically conductive connection and touching areally being able to contact the lateral inner walls of a fold.

In an alternative, the folding of the substrate can, however, take place such that a region of a cover electrode of an electronic component to be used for the electrically conductive connection is arranged in the folded condition below its respective electrical component and lies there on a region of the base electrode of the electronic component arranged next to it.

Modules in accordance with the invention can be manufactured so that the electronic components are formed next to one another on a flexible planar substrate and are arranged at a spacing from one another. In this respect, a respective base electrode is first formed on a surface of a substrate, an optically active layer is formed on the base electrode and a cover electrode is then formed thereon. Free substrate surfaces are present on the surface of the substrate between the electronic components so that the individual electronic components are arranged electrically isolated from one another on an unfolded substrate. The electrically conductive connection can be established by a forming of folds in regions of free substrate surfaces by the projecting/overlapping of base electrodes and cover electrodes at the respective optically active layers of a respective electronic component in that the fold formation takes place such that projecting regions of a base electrode of an electronic component are brought into touching contact areally with regions of a cover electrode of an electronic component arranged next to it and both electronic components are thereby electrically conductively connected to one another.

The cover electrodes, the base electrodes and the optically active layers of electronic components can be formed with a thin film process (e.g. CVD, PVD) and/or by imprinting. This can, however, also take place by other processes such as blade coating.

Subsequent to or on the formation, a structuring can also be carried out.

A flexible, planar, sheet-shaped substrate which is present, for example, in the form of a sheet of paper, can be used in this process.

There is, however, also the possibility of unwinding a substrate material from a roll, then forming the electronic components with cover electrode, base electrode and active layer on a substrate surface in an unwound region and then winding it up onto another roll again from which it can subsequently again be unrolled for a further processing with a formation of folds. There is, however, also the possibility of only forming one of the electrodes or the optically active layer on a substrate surface after the unrolling and before the winding up onto a roll.

A module in accordance with the invention can be manufactured by separating a presettable number of electronic components from a substrate unrolled as already addressed or by another separation from a sheet-shaped substrate and subsequent folding and can then have a respective desired number of electronic components or cells.

As already addressed a multiple of times, a folding of the substrate provided with electronic components can then take place and the respective electrical resistance of the electrical series connection formed with the electrically conductively connected electronic components can be determined. It can thereby easily be detected whether one or more electronic components of a module are defective.

However, the individual cells formed on a substrate can also be subjected to a function test in which, for example, the electrical conductivity is determined.

If a defective electronic component is detected, there are basically two possibilities of establishing the functionality of a module completely, but at least partly in an again sufficient manner.

In this respect, in a first alternative, a defective electronic component can be completely removed by a separation process in which it is cut out from the module and a new defect-free electronic component can be added in its place, with then the electrically conductive connection, additionally with material continuity, to respective adjacent base electrodes and cover electrodes of the two electronic components arranged next to the newly inserted electronic component being able to be established with the aid of an electrically conducting adhesive.

In a second alternative, there is, however, also the possibility of folding the substrate with the electronic components formed thereon such that a defective electronic component is arranged on the optically not active side of a module and the folding was carried out so that the cover electrode and the base electrode of the two electronic components arranged next to a defective electronic component contact one another areally after the folding and the electrically conductive connection of these two electronic components can thus be established.

The defective electronic component can thus admittedly no longer be used, but this does not apply to the total module.

With modules in accordance with the invention, the total thickness is increased in the region of the folds, which enables an improved protection from mechanical damage.

The total electrical resistance of a series connection of electronic components can be reduced using the already addressed additional coatings in regions of electrodes to be electrically conductively connected to one another, which can be achieved, for example, by a vapor coating with metals with better electrical conductivity. Such coatings are arranged in non-critical regions of modules by folding so that the respective activity on the useful active surface of a module is not substantially impaired.

The modules in accordance with the invention can moreover be protected very simply, cost-effectively and securely in order, for example, to avoid a penetration of water (vapor) and oxygen as frequently very critical influences. Drying means known per se can in particular be provided at, integrated in and/or encapsulated in a module with electronic components (organic solar cells, OLEDs) which are formed with organic components.

On the selection of suitable substances and compounds for the substrate, for the electrodes and for the optically active layer, a module can also be optically transparent.

There is also the possibility of connecting a plurality of modules to one another. These modules can then also be electrically conductively connected to one another. This can also be achieved by additional electrical conductive tracks which are formed on substrates.

Openings can be formed at the substrate for the simplification of the folding or also for a complete removal of defective components. Said openings can be made in punctiform shape or in slit shape. There is also the possibility to reduce the thickness of the substrate at least regionally alone or in combination with openings. This is done between components, which are arranged next to one another, in the region of the free substrate surface. The openings and/or regions with reduced substrate thickness should be arranged along a straight line which can extend parallel to the outer margins of cover electrodes and base electrodes.

The reduction of the substrate thickness can take place using a scoring tool which is preferably adjustable to be able to change the scoring or cutting depth. The forming of these regions should take place from the rear side of the substrate to avoid any damage to barrier layers which may optionally be present and any particle formation on the active side of the module.

BRIEF DESCRIPTION OF DRAWINGS

The invention should be explained in more detail by way of example in the following.

There are shown:

FIG. 3 a cross-sectional representation of a substrate which is provided with electronic components which is folded in a different manner and which is arranged between plate-shaped elements; and FIG. 4 a plurality of representations of a module which can be connected and fixed to a carrier.

DETAILED DESCRIPTION

Figure 1:
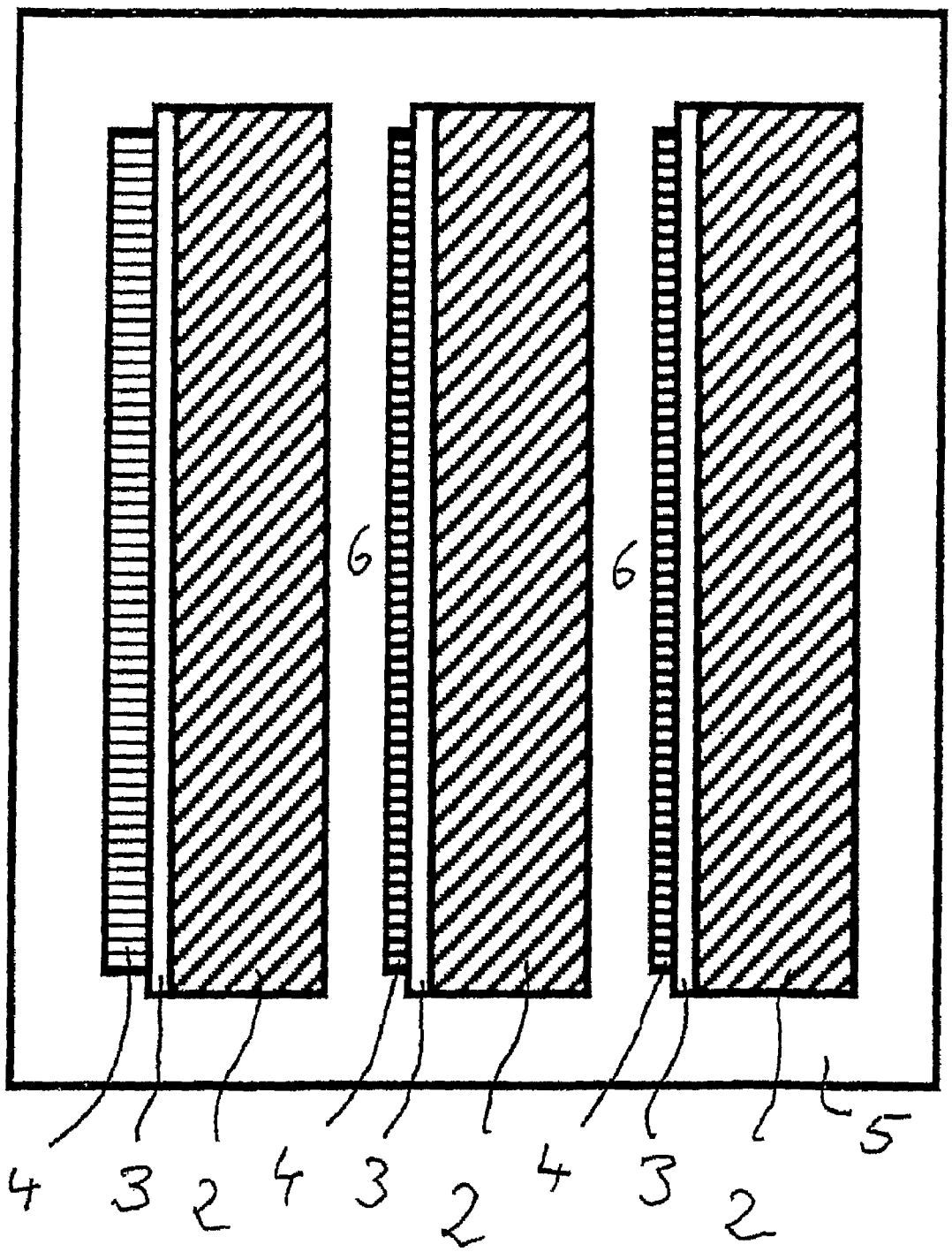
FIG. 1 a plan view of a substrate on which three electronic components are formed.

A sheet of paper is shown as a substrate 5 in a plan view in FIG. 1. In this example, three electronic components 1 are formed on the substrate 5. In this respect, a base electrode 4 has been formed on the direct surface of the substrate 5, an optically active layer 3 has been formed on the base electrode 4 and a cover electrode 2 for each of the components 1, three here, has been formed on the optically active layer 3. In this respect, a layer of aluminum was formed for the base electrodes 4, a layer comprising ZnPC (with phthalocyanine being able to be doped) was formed for the optically active layers 3, C 60, also called Buckminster, can also be used here, and a layer of indium-tin oxide (ITO) was formed for the cover electrodes 2.

It becomes clear from the plan view shown in FIG. 1 that the base electrodes 4 project over the optically active layer 3 at the side at the left here. In the cover electrodes 2, this is the case on the oppositely disposed side, that is, the right side here.

Free substrate surfaces 6 in which the paper forming the substrate 5 can be free of any additional coatings and which is electrically isolating can be present between the electronic components 1.

It moreover becomes clear from the view shown in FIG. 1 that the base electrodes 4 are shorter in their length, that is, in the vertical axial direction here, than the optically active layers 3 and also the cover electrodes 2. There is the possibility, in an embodiment not shown, to provide the outer margins of the base electrodes 4 with a passivation layer. Electrically isolating layers, e.g. polyimide, can be formed at the edges of electrodes for this purpose.

The outer rim of the substrate 5 is likewise kept free and can, as indicated by the outer lines, likewise be turned over by folding, with the turning also being able to be facilitated by corresponding incisions in the substrate 5.

Figure 2:
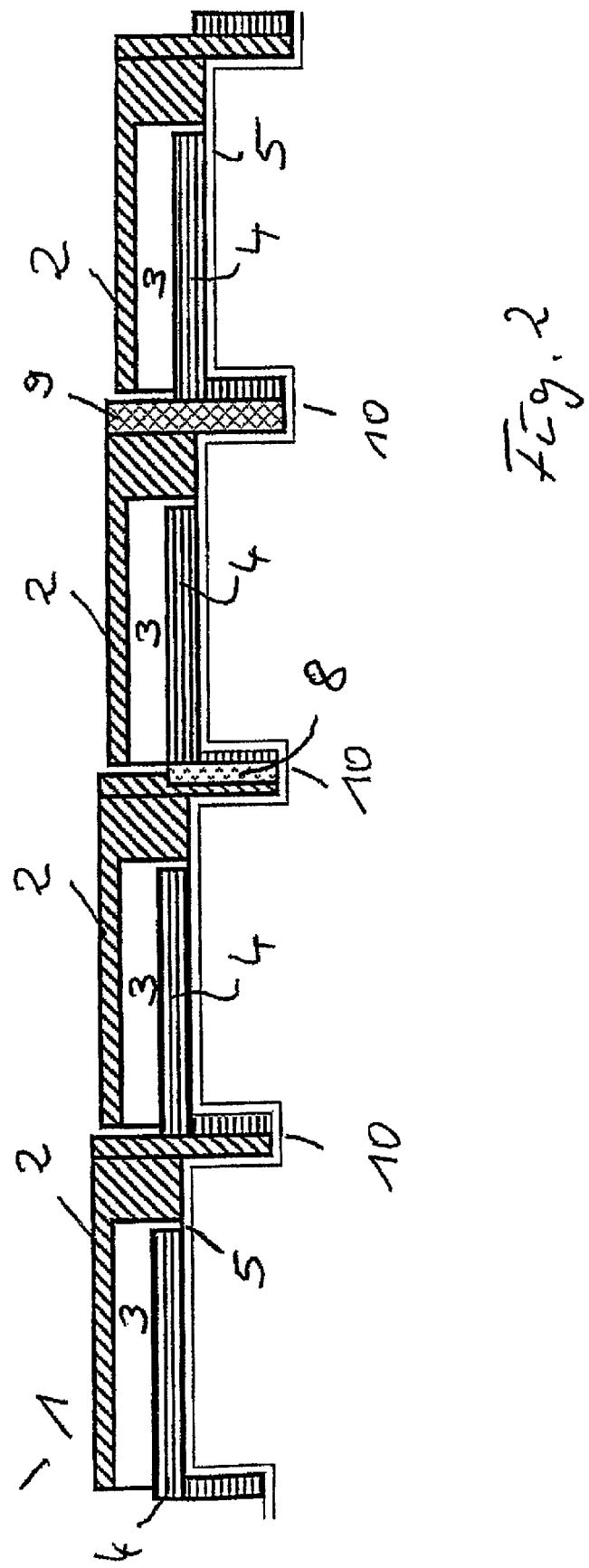
FIG. 2 a substrate provided with electronic components in a cross-sectional representation after folding.

A possibility for the folding of a substrate 5 provided with electronic components 1 should be illustrated by FIG. 2. In this respect, the folds 10 are formed in U shape in the cross-section shown so that a region of a cover electrode 2 of the electronic component 1 shown at the left in FIG. 2, said region overlapping/projecting over an active layer 3, can be brought into areal touching contact with a region of the base electrode 4 of the electronic component 1 arranged at the right next to it, said region projecting over/overlapping an active layer 3, and the electrically conductive connection between these two electronic components 1 can thus be established.

The electrically conductive connection between the two electronic components 1 arranged at the right next to it, that is, at the center here, has been improved by an additional coating 8 which is formed from copper here. This coating 8 can in this respect be formed on the region of the cover electrode 2 projecting over the active layer 3 and/or on the region of the base electrode 4 projecting over the active layer 3 of the electronic component 1 adjacent thereto. The electrical contacting of these two electronic components 1 can thereby be improved. The same effect is, however, also achievable with an electrical conductive adhesive 9 such as is shown in the electrically conductive connection of the two electronic components 1 shown at the far right in FIG. 2. However, additionally a connection with material continuity can also be achieved with the electrical conductive adhesive 9, said connection also being able to result in an improved mechanical stability and strength of a module in accordance with the invention.

The electrical current flow can therefore be directed either from left to right or from right to left via the electronic components 1 of a module.

In the example shown in cross-section in FIG. 3, a substrate 5, such as has already initially been explained, can be folded so that the region of the cover electrode 2 projecting over an active layer 3 of the electronic component 1 shown at the right here is arranged at least partly below the active layer 3 of this electronic component 1 and moves there into an areal touching contact with the region of the base electrode 4 of the electronic component 1 shown at the left here, said region projecting over the active layer 3 and these two regions of the two electrodes being able to establish an electrically conductive connection between these two electronic components 1.

An optically transparent plate-shaped element 7 is arranged above the substrate 5 provided with the electronic components 1 and a second plate-shaped element 7 is arranged on the rear side, that is, in the region in which folds 10 of the substrate 5 are arranged.

The previously folded substrate 5 with the electronic components 1 can be compressed using the plate-shaped elements 7, which can be rigid plates, for example, the electrically conductive connection can thereby be improved and a protection can be reached against external environmental influences.

Subsequently hereto, the plate-shaped elements 7 can be sealed against environmental influences by suitable means at their outer free margins so that the substrate can then be fully encapsulated with the electronic components 1.

A possibility should be illustrated by FIG. 4 how a module 12 in accordance with the invention can be formed with a carrier 11. In this connection, slits 11' are formed at an elastically deformable carrier 11. If such a carrier 11 is bent, the slits 11' at the then convexly curved side widen. The folds 10 can then be introduced into the slits 11' and, after the carrier 11 has adopted its original design/shape again, the folds 10 are held clampingly in the slits 11' as is illustrated in the lower representation of FIG. 4. The electrically conductive connection can thus be improved and also maintained permanently by the compressive forces acting on the folds 10 as a consequence of the elasticity of the carrier material (preferably a dielectric polymer, particularly preferably an optically transparent polymer).

The width of the slits should be selected such that the thickness in the region of a fold 10 is taken into account and in this respect a slit 11' has a clearance which is slightly smaller than the thickness of a fold 10.

Slits 11' should be aligned parallel to one another and should be arranged with respect to one another and to respective folds 10 of a module 12 such that at least some, preferably all folds 10 can be introduced into slits 11' of a carrier 11 and can be clampingly held therein.

It is favorable if a module 12 then areally contacts the surface of the carrier 11 with its folds 10 clamped in slits 11' and fixed in this manner.

A carrier 11 can be made in plate shape and should have a thickness which is larger than the slit depth.

The possibilities for a fixing of a module 12 to a carrier 11 are shown step-wise in the four representations reproduced in FIG. 4.

The invention claimed is:

1. A module in which areal electronic components are formed, comprising:
    a cover electrode covering the electronic components;
    a flexibly deformable substrate;
    a base electrode formed on the substrate; and
    an optically active layer formed on the base electrode,
    wherein the electronic components are formed on the flexibly deformable substrate by the optically active layer, the cover electrode; and the base electrode;
    wherein the cover electrode projects over the optically active layer at a first side and the base electrode extends beyond the optically active layer at a second side which is oppositely disposed with regards to the first side;
    wherein the components are arranged at a spacing from one another on the substrate and thereby a free substrate surface is present between components so that, on a folding in a region of the free substrate surface, the base electrode and the cover electrode are adjacent and contact one another areally and an electrically conductive touching contact is established; and wherein the electronic components are electrically connected in series with one another.

2. The module of claim 1, wherein the electronic components are one of solar cells and organic light-emitting diodes.

3. The module of claim 1, wherein the substrate is selected from one of a paper, cardboard, a polymer film, a metal film and a composite of these materials.

4. The module of claim 1, wherein the module is arranged between at least two elements exerting a compressive force in a folded state.

5. The module of claim 4, wherein the module is arranged between two plate-shaped elements.

6. The module of claim 1, wherein an outer marginal region of the substrate is kept free peripherally.

7. The module of claim 1, wherein at least one of the base electrode and the cover electrode is situated at least in regions with which an electrically conductive connection is achieved by touching contact using a coating, the coating having a smaller specific electrical resistance than the respective electrode.

8. The module of claim 1, wherein the regions of the base electrode and the cover electrode of an electronic component are arranged next to the components which are disposed areally at one another and are connected with material continuity with an electrical conductive adhesive.

9. The module of claim 1, wherein the substrate one of (a) includes a protective layer at least one surface and (b) is designed as a protective layer.

10. The module of claim 1, wherein the module is at least one of convexly curved and concavely curved in the folded condition.

11. The module of claim 1, wherein folds of the substrate are one of U-shaped and V-shaped.

12. The module of claim 1, wherein a first region of the cover electrode is arranged below its component in the folded state, a second region of the base electrode being arranged next to the first region and the electrically conductive connection between these two electronic components is thus established.

13. The module of claim 1, wherein the cover electrode is formed from one of (a) an electrically conductive and optically transparent substance and (b) an electrically conductive and optically transparent chemical compound.

14. The module of claim 1, wherein elements are optically transparent and electrically isolating.

15. The module of claim 1, wherein elements are impermeable to gases and liquids.

16. The module of claim 1, wherein the electronic components are electrically conductively connected to one another after folding so that at least one of the cover electrode and the base electrode is contacted with one other.

17. The module of claim 1, wherein the electronic components are arranged on the substrate at a module in a series arrangement and a column arrangement.

18. The module of claim 17, wherein at the electronic components, the cover electrode projects downward beyond the optically active layer at one side, which is at a right angle to the side at which the cover electrode projects over the optically active layer, the base electrode extends past the optically active layer at a side of the optically active layer disposed opposite the cover electrode and the components are likewise arranged at a right angle at a spacing from one another on the substrate and thereby a free substrate surface is present between components so that, on a folding at a right angle to a first folding, the base electrode and the cover electrode of electronic components arranged above one another contact one another areally in the region of the free substrate surface and an electrically conductive contact is established and the electronic components form a series arrangement and a column arrangement.

19. The module of claim 1, wherein slits are formed at one side of an elastically deformable carrier, folds of the module being configured to be introduced into the slits and clampingly held therein.

20. The module of claim 19, wherein the slits are formed aligned parallel to one another in the carrier and a respective slit is associated with a corresponding fold of the module.

21. The module of claim 19, wherein the module is held with the folds clamped in the slits such that it areally contacts the surface of the carrier.

22. The module of claim 1, wherein the substrate has at least one of (a) openings between components in the region of free substrate surfaces and (b) a reduced thickness at least regionally.

23. The module of claim 22, wherein at least one of the openings and the reduced thickness is one of arranged and formed along a straight line.

24. A method for manufacturing a module in which areal electronic components are formed, comprising:
    forming base electrodes of the module next to one another and at a spacing from one another on a flexible planar substrate of the module;
    forming optically active layers of the module on the base electrodes; and
    forming cover electrodes of the module on the optically active layers,
    wherein the base electrodes project over the optically active layers at a first side and the cover electrodes project over the optically active layers at a second side of the electronic components, the second side being opposite to the first side,
    wherein electronic components are formed in a series arrangement on the substrate between which free substrate surfaces are present, and
    wherein the substrate is folded in the region of the free substrate surfaces after forming the electronic components so that a region of the base electrodes areally contacts a region of the cover electrodes arranged next to it and electrically conductively connects the two electronic components.

25. The method of claim 24, wherein at least one of the cover electrodes, the optically active layers, and the base electrodes are formed by one of a thin film process and imprinting.

26. The method of claim 24, wherein, in the forming of the cover electrodes, the optically active layers, and the base electrodes, the substrate is unwound from a roll and is then wound onto another roll.

27. The method of claim 24, further comprising:
    electrically conductively connecting the components formed on the substrate are after the folding; and
    determining the electrical resistance of the electrical series connection thus formed.

28. The method of claim 27, further comprising:
    separating a detected defective electronic component from the substrate, a separation site being connected again with material continuity.

29. The method of claim 28, wherein the connection is established with an electrical conductive adhesive.

30. The method of claim 24, further comprising:
    folding a detected defective electronic component so that it is arranged below the substrate and the two electronic components arranged next to the defective electronic component on opposite sides thereof are electrically conductively connected to one another by folding the substrate.

31. The method of claim 24, further comprising:
folding free margins present at an outer margin of the substrate to form an edge protection.

32. The method of claim 24, further comprising:
after the folding, compressing the module between at least two elements at least in the region of the folds.

* * * * *